Figure 1:
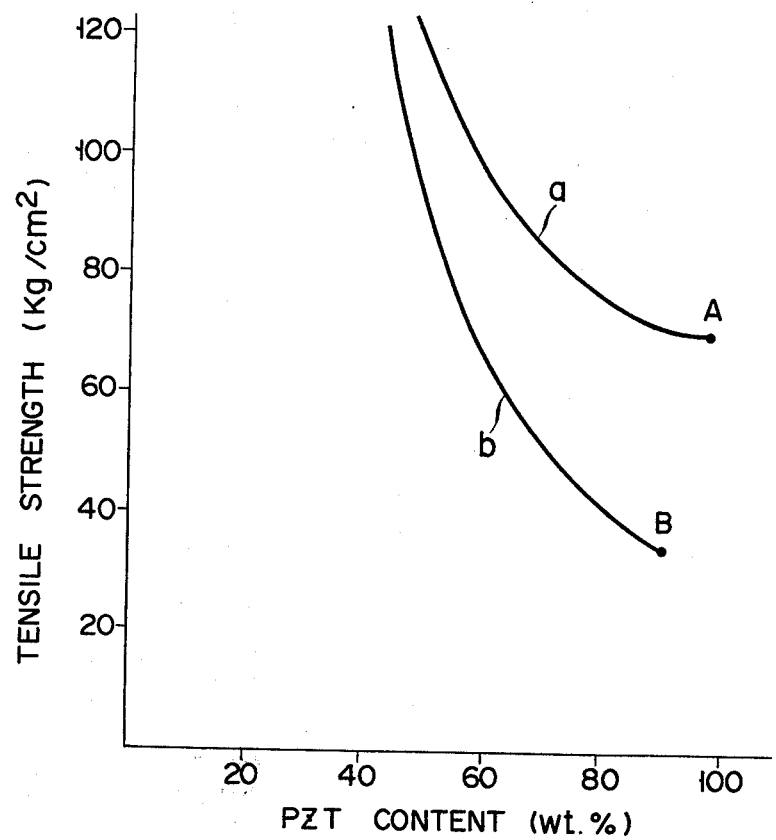

United States Patent [19]

Fujimori et al.

[11] 4,265,841

[45] May 5, 1981

[54] METHOD FOR PRODUCTION OF COMPOSITE PIEZOELECTRIC MATERIAL

[75] Inventors: Yoshinori Fujimori, Kawasaki; Akio Ishizawa, Tokyo; Minoru Hashimoto, Yokohama, all of Japan

[73] Assignee: Tokyo Shibaura Denki Kabushiki Kaisha, Kawasaki, Japan

[21] Appl. No.: 77,264

[22] Filed: Sep. 20, 1979

[30] Foreign Application Priority Data

Sep. 21, 1978 [JP] Japan ................................. 53-115087
Sep. 27, 1978 [JP] Japan ................................. 53-118044
Jun. 28, 1979 [JP] Japan ................................. 54-80696

[51] Int. Cl.³ ........................ B29C 25/00; B29B 1/04; B29G 7/00
[52] U.S. Cl. ....................................... 264/22; 264/123
[58] Field of Search ..................... 264/24, 61, 60, 22, 264/111, 123

[56] References Cited

U.S. PATENT DOCUMENTS

| | | | |
|---|---|---|---|
| 3,187,068 | 6/1965 | Vries et al. | 264/24 |
| 3,517,093 | 6/1970 | Wentzel | 264/61 |
| 3,518,756 | 7/1970 | Bennett et al. | 264/61 |
| 3,767,505 | 10/1973 | Coran et al. | 264/24 |
| 3,867,299 | 2/1975 | Rohatgi | 264/24 |
| 4,104,345 | 8/1978 | Anderson et al. | 264/61 |
| 4,148,853 | 4/1979 | Schuber | 264/61 |

Primary Examiner—James B. Lowe
Attorney, Agent, or Firm—Oblon, Fisher, Spivak, McClelland & Maier

[57] ABSTRACT

Disclosed is a method of producing composite piezoelectric materials exhibiting a high flexibility and a high piezoelectric effect, comprising the steps of treating an inorganic dielectric material powder with a latex-containing dispersion so as to coat the surfaces of the powder particles with the rubber particles in a manner to provide encapsulated powder particles, kneading the encapsulated powder particles, shaping the kneaded mass, and polarizing the shaped mass.

10 Claims, 2 Drawing Figures

METHOD FOR PRODUCTION OF COMPOSITE PIEZOELECTRIC MATERIAL

This invention relates to a method of producing a composite piezoelectric material consisting essentially of a polymeric material and an inorganic ferrodielectric powder, particularly, to a method of producing a composite piezoelectric material exhibiting both high flexibility and high piezoelectric effect.

Known materials exhibiting a piezoelectric effect include, for example, crystals such as rock crystal and Rochelle salt and ceramics like barium titanate. These materials certainly exhibit a high piezoelectric effect, but are hard and fragile, resulting in that it is very difficult to obtain a piezoelectric element formed of a large thin film prepared from these materials.

A uniaxially stretched film of an amino acid polymer like polybenzyl glutamate and an organic material such as polyvinyl chloride or polyamide are also known to exhibit a piezoelectric effect. However, the piezoelectric effect of these materials is low. For example, β-polyvinylidene fluoride, which is said to exhibit the highest piezoelectric effect among the materials of this type, exhibits only about $6.2 \times 10^{-12}$ m/V of piezoelectric constant $d_{31}$ of length extentional mode.

Recently, a composite piezoelectric material has been proposed which consists of a matrix of thermoplastic polymeric material and a piezoelectric ceramic powder such as lead zirconate titanate, hereinafter referred to as "PZT", loaded in the matrix. The composite piezoelectric material is relatively easy to be formed into a thin film and exhibits a relatively high piezoelectric effect. However, the piezoelectric effect of the composite material depends to a large extent on the amount of the piezoelectric ceramic powder loaded in the matrix. Certainly the piezoelectric effect can be increased by increasing the amount of the powder loaded in the matrix. But, the increased loading brings about a marked reduction in the flexibility of the composite material, resulting in that the machanical characteristics such as hardness and fragility of the composite material are rendered close to those of the inorganic crystal or ceramics. Under the circumstances, the optimum amount of the piezoelectric ceramic powder loaded in the polymer matrix was practically about 75% by weight.

It has also been proposed recently to use fluororubber of hexafluoropropylene-tetrafluoroethylene copolymer as the polymer matrix for improving the piezoelectric property, with the flexibility and workability of the composite material maintained at an acceptable level. In any case, however, a composite piezoelectric material consisting of a polymer matrix and a piezoelectric ceramic powder loaded in the matrix fails to exhibit sufficiently high piezoelectric property and flexibility. For example, the amount of the polymer matrix or binder should be at least 10% by weight for enabling the composite material to exhibit a satisfactory flexibility. In this case, however, the piezoelectric effect of the composite material is inevitably rendered unsatisfactory. Further, it is difficult to disperse the ceramic powder uniformly into the matrix because, for example, nonuniform temperature distribution occurs unavoidably in the kneading step of the mixture of the polymer matrix and the piezoelectric ceramic powder. It should be noted that the incapability of uniform ceramic powder dispersion leads to a low reproducibility of the characteristics of the composite material.

An object of this invention is to provide a method of producing a composite piezoelectric material exhibiting a high flexibility and a high piezoelectric effect. In addition, the composite material produced by the method of this invention exhibits a high thermal stability.

According to this invention, there is provided a method of producing a composite piezoelectric material, comprising the steps of treating an inorganic dielectric material powder with a latex-containing dispersion so as to coat the surfaces of the powder particles with the rubber particles contained in the latex in a manner to provide encapsulated powder particles, kneading the encapsulated powder particles, shaping the kneaded mass, and polarizing the shaped mass.

Figure 2:
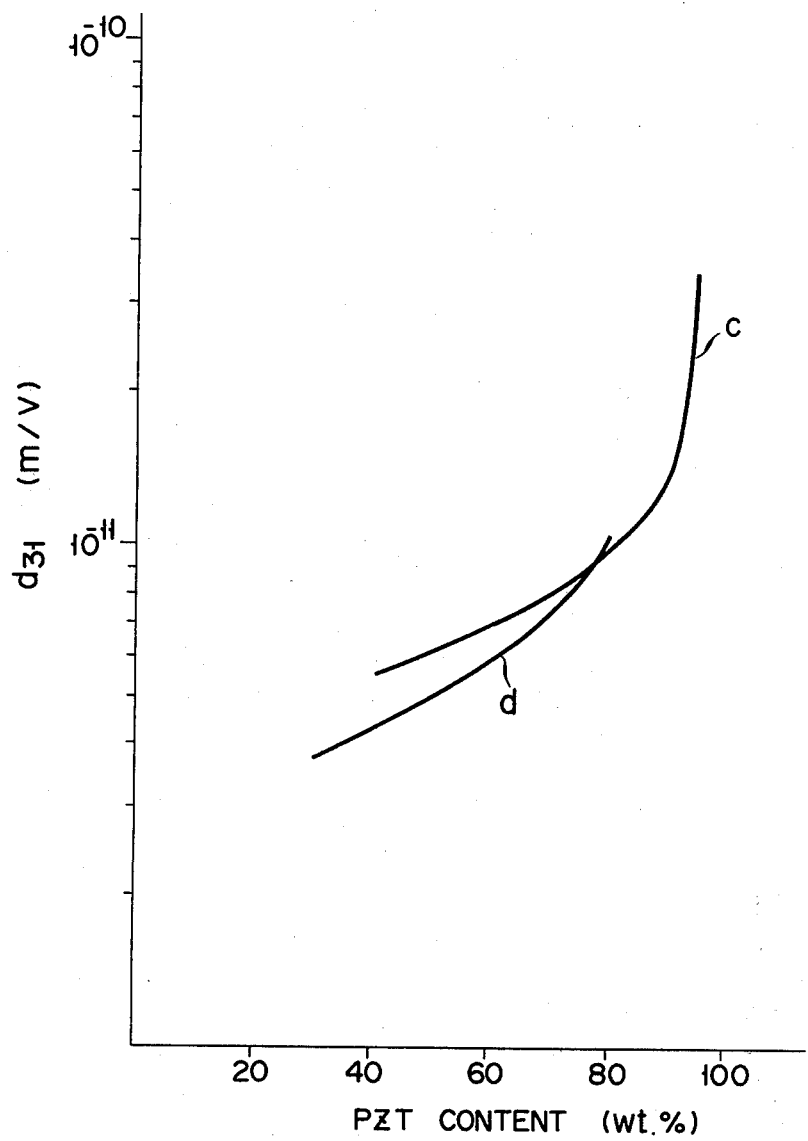

This invention can be more fully understood from the following detailed description when taken in conjunction with the accompanying drawings, in which:

FIG. 1 is a graph showing the relationship between the PZT content and the tensile strength of composite piezoelectric materials produced by the method of the present invention and the conventional method, and FIG. 2 is a graph showing the relationship between the PZT content and $d_{31}$ of composite piezoelectric materials produced by the method of the present invention and the conventional method.

In this invention, an inorganic dielectric material powder is treated with a latex-containing dispersion so as to coat the powder particles with rubber in a manner to provide encapsulated powder particles, followed by kneading and shaping steps, thereby obtaining a composite material having the inorganic dielectric material powder very uniformly dispersed therein. The particular technique permits markedly increasing the inorganic dielectric material content without impairing the mechanical property and flexibility of the composite material. A polarizing treatment is then applied to the shaped mass of the composite material so as to produce a composite piezoelectric material having a high flexibility and exhibiting an excellent piezoelectric effect.

Described in detail in the following is one embodiment of this invention.

Used is an inorganic dielectric material powder having an average particle size of 1.0 to 80μ preferably 1.5 to 10μ, which has been prepared by powdering an inorganic dielectric material sintered at, for example, 1,200° C. Specifically, the powder is mixed with water and the mixture is agitated for providing a suspension, followed by adding latex to the suspension while stirring the aqueous system so as to coat the surfaces of the powder particles with rubber. Then, a coagulating agent is added to the system for coagulating the rubber particles, thereby obtaining a composite material consisting of the inorganic dielectric material powder particles wrapped in rubber capsules. The encapsulated particles are water-washed, dried, kneaded by, for example, a roll mill, and, then, shaped by, for example, a roll calender into a sheet. It is possible to employ press molding in the shaping step. Then, a polarizing treatment is applied to the sheet. Specifically, electrodes are mounted to both sides of the sheet and a D.C. electric field of 20 to 500 KV/cm is applied across the electrodes within a silicone oil maintained at a temperature of room temperature to melting point of the rubber for 15 minites to 24 hours, followed by cooling the silicone oil down to room temperature, thereby imparting a piezoelectric property to the composite material.

Any kind of inorganic dielectric material powder can be used in this invention, though it is preferred to use piezoelectric ceramics of perovskite structure represented by a general formula $A^{2+}B^{4+}O_3$, $A^{1+}B^{5+}O_3$ or $A^{3+}B^{3+}O_3$. The inorganic dielectric material content of the composite piezoelectric material should be 20 to 97% by weight, preferably, 80 to 96% by weight.

The latex used in this invention is an aqueous colloidal solution of rubber particles including particles of natural rubber, or synthetic rubber such as acrylonitrile-butadiene rubber (NBR), styrene-butadiene rubber (SBR), modified acrylic ester rubber and butadiene rubber (BS). The rubber content of the composite material should be 3 to 80% by weight, preferably, 4 to 20% by weight. Further, the solid material content of the latex should preferably be 10 to 60% by weight, preferably, 40 to 51% by weight.

The coagulating agent used in this invention is provided by, for example, formic acid, acetic acid, alcohol, ketone, and an aqueous solution or alcoholic solution of polyvalent salts like calcium nitrate and calcium chloride.

In this invention, it is possible to add, if necessary, a vulcanizing agent such as ZnO, a vulcanizing accelerator, a vulcanizing supplement accelerator, an activator, an aging inhibitor, a dispersing agent, a stabilizing agent, an emulsifying agent, a thickening agent, a wetting agent, etc. to the suspension or latex.

In the embodiment described above, latex is added to an aqueous suspension of an inorganic dielectric material powder. But, it is possible to add the inorganic dielectric material powder to an aqueous dispersion of the latex. Alternatively, it is possible to add the powder and the latex simultaneously to water. In any case, the inorganic dielectric material powder is treated with a latex-containing dispersion so as to coat the surfaces of the powder particles with rubber. Further, water used as the dispersion medium in the embodiment described above can be replaced by lower alcohols such as ethyl alcohol or ketones such as acetone.

According to another embodiment of this invention, the inorganic dielectric material powder is treated with a dispersion containing both a radical polymerizable vinyl monomer and latex. In this case, an inorganic dielectric material powder having an average particle size of 1.0 to 80μ, preferably 1.5 to 10μ, which has been prepared by powdering an inorganic dielectric material sintered at, for example, 1,200° C. is suspended in a treating dispersion containing a radical polymerizable vinyl monomer and latex. The resultant suspension is agitated by using a roll mill or the like for 0.2 to 5 hours at a temperature of room temperature to melting point of the rubber, e.g., 60° C. In this case, the vinyl monomer is deposited first on the surfaces of the powder particles and, then, graft copolymerization reaction is carried out between the vinyl monomer and the latex, resulting in that a graft copolymer complex is formed on the surfaces of the powder particles. The powder particles having the graft copolymer complex between the vinyl monomer and the latex formed thereon are water-washed, dried, kneaded, shaped and, then, polarized as in the embodiment described previously, thereby obtaining a composite piezoelectric material having improved mechanical strength and oil resisting property. The improvements is thought to be accounted for by graft copolymerization between the vinyl monomer and the rubber. Incidentally, it is possible to add to the treating dispersion a material serving to supply bisulfite to the dispersion such as a SO₂ gas, a bisulfite aqueous solution or a mixture of sulfite and acid. The amount of the additive should be 0.001 to 10% by weight of the inorganic dielectric material in terms of the SO₂ amount.

The radical copolymerizable vinyl monomers used in this invention include, for example, monomers represented by a general formula $CH_2=CHCOOC_nH_{2n+1}$ or

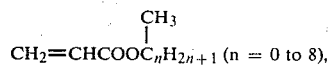

$CH_2=CHCOOC_nH_{2n+1}$ (n = 0 to 8), as well as acrylic ester, acrylonitrile, methacrylonitrile, epoxides of acrylic acid or methacrylic acid, styrene, acrylic acid amide, vinyl acetate, methyl vinyl ketone, acrolein, ethylvinylether, diethylene glycol dimethacrylate, diethylene glycol diacrylate, diethylene glycol triacrylate, and diethylene glycol trimethacrylate. These monomers may be used singly or in combination. It is possible to add, if necessary, a graft copolymerization initiator such as potassium persulfate, ammonium persulfate or benzoyl peroxide to the treating dispersion in carrying out the graft copolymerization reaction between the vinyl monomer and rubber. The amount of the vinyl monomer should be 0.5 to 10% by weight based on the amount of the inorganic dielectric material.

According to still another embodiment of this invention, the inorganic dielectric material is treated with a dispersion containing a polar fluoropolymer dispersion and latex. In this case, an inorganic dielectric material powder having an average particle size of 1.0 to 80μ, which has been prepared by powdering an inorganic dielectric material sintered at, for example, 1,200° C., is mixed with water, followed by adding a polar fluoropolymer dispersion to the resultant aqueous suspension of the powder particles. Then, latex is added to the aqueous system while stirring the system so as to coat the surfaces of the powder particles and the fluoropolymer particles with rubber, followed by adding a coagulating agent to the system for coagulating the rubber. The polar fluoropolymer dispersion used in this embodiment is a colloidal solution of polar fluoropolymer including, for example, polyvinylidene fluoride, vinylidene fluoride-trifluoroethylene copolymer, polytrifluorochloroethylene and polyvinylfluoride, dispersed in an organic polar solvent such as dimethyl phthalate or dimethyl formamide. The fluoropolymer content of the composite material should be at most 98.5% by weight, preferably, 80 to 96% by weight. The composite piezoelectric material thus obtained contains the polar fluoropolymer having high piezoelectric constant $d_{31}$, and exhibits high piezoelectric effect.

As described above in detail, the method of this invention permits producing a composite piezoelectric material exhibiting a high flexibility, a high piezoelectric effect and a high thermal stability.

Incidentally, it is possible to improve the oil-resisting property, heat-resisting property, solvent-resisting property, flexibility, etc. of the composite piezoelectric material depending on the use of the piezoelectric material by appropriately selecting the kind of latex used.

Described in the following are Examples of this invention.

EXAMPLE 1

50 g of lead zirconate titanate (PZT) powder, i.e., inorganic dielectric material powder, having an average particle diameter of 5μ was dispersed in 200 ml of deionized water for preparing a suspension. Then, 6.4 g of NBR latex (solid content being 2.6 g) was added to the suspension and the mixture was fully stirred for dispersing the latex in the suspension, followed by gradually dripping 40 cc of an aqueous solution containing 0.1 mol/l of calcium chloride to the suspension, which was kept stirred, so as to coagulate the NBR latex. The powder particles having the rubber coagulated thereon were washed with water and, then, dried so as to obtain a composite material consisting of 95.0% by weight of PZT powder and NBR.

The composite material thus obtained was kneaded by using a roll mill, followed by shaping the kneaded mass by using a roll calender so that the length of the elongated mass was 5 times as that before the elongation (elongation degree being 5), thereby obtaining a sheet 148μ thick. Then, Ag electrodes each having a thickness of 2μ were formed on both sides of the sheet by employing a vacuum deposition under a pressure of less than $3.5 \times 10^{-6}$ torr. Finally, a polarizing treatment was applied to the composite material sheet by applying a D.C. electric field of 210 KV/cm across the electrodes for 1.5 hours within a silicone oil housed in a constant temperature bath maintained at 120° C., followed by lowering the temperature of the constant temperature bath to room temperature for cooling the composite material sheet. The piezoelectric property of the resultant composite piezoelectric material was measured, finding out that the piezoelectric constant $d_{31}$ of length extensional mode was $0.94 \times 10^{-11}$ m/V.

An additional experiment was conducted in line with the above except that the amount of NBR latex used was 12.20 g (solid content being 5.0 g). In this case, the produced composite piezoelectric material, containing 90.9% by weight of PZT, had $0.73 \times 10^{-11}$ m/V of $d_{31}$.

For comparison, a mixture consisting of 50 g of PZT powder having an average particle diameter of 5μ and 2.6 g of NBR was kneaded by a roll mill, followed by roll calendering. But, it was impossible to obtain a sheet. So, the amount of NBR was increased to 5 g. Specifically, a mixture consisting of 50 g of the PZT powder mentioned above and 5 g of NBR was kneaded by a roll mill, followed by shaping the kneaded mass into a sheet 148μ thick by using a press machine. Further, a polarizing treatment was applied to the sheet as in the experiments described above, thereby obtaining a control sample.

Table 1 shows the breakdown voltage, delectric constant, dielectric loss, piezoelectric constants $d_{31}$ and $d_{33}$, tensile strength and Young's modulus of the two samples produced by the method of this invention and the control sample. The tensile strength was measured by applying an instron tester to the composite material sheet sample punched by a dumbbell-wise No. 3 type puncher.

TABLE 1

| PZT content | Breakdown Voltage (KV/cm) | Dielectric Constant (1KHz) | Dielectric Loss (1KHz) | Young's Modulus (N/m²) | $d_{31}$* (m/V) | $d_{33}$** (m/V) | Tensile Strength (Kg/cm²) |
|---|---|---|---|---|---|---|---|
| Example 1 (95.0 wt%) | 243 | 86 | 0.0522 | $3.5 \times 10^9$ | $9.4 \times 10^{-12}$ | $20.2 \times 10^{-12}$ | 45 |
| Example 1 (90.9 wt%) | 251 | 81 | 0.0511 | $2.9 \times 10^9$ | $7.3 \times 10^{-12}$ | $14.8 \times 10^{-12}$ | 49 |
| Control (95.0 wt%) | Impossible to prepare a composite material sheet. | | | | | | |
| Control | 208 | 74 | 0.0508 | $6.8 \times 10^9$ | $2.8 \times 10^{-12}$ | $6.1 \times 10^{-12}$ | 22 |

*Piezoelectric constant of length extensional mode.
**Piezoelectric constant of thickness extensional mode.

Table 1 clearly shows that the composite piezoelectric material produced by the method of this invention is advantageous over the control sample in breakdown voltage, piezoelectric property and mechanical property, where the rubber content of the material is equal to or lower than that of the control sample. In the control sample, the inorganic dielectric material and the rubber are not mixed with each other uniformly. In the present invention, however, the surfaces of the inorganic dielectric material powder particles are uniformed coated with the rubber. In addition, the inorganic dielectric material is uniformly dispersed in the composite material. The uniformity mentioned is supposed to enable the composite piezoelectric material of the present invention to exhibit the excellent properties.

EXAMPLE 2

50 g of a lead titanate type ceramic powder having an average particle diameter of 2.4μ was dispersed in 200 ml of deionized water for preparing a suspension. Then, 5.8 g of acrylic acid ester copolymer latex (solid content being 2.6 g) was added to the suspension and the mixture was fully stirred for dispersing the latex in the suspension, followed by gradually dripping 40 ml of an aqueous solution containing 0.01 mol/l of sulfurous acid to the suspension, so as to coagulate the latex. The ceramic powder particles having the rubber coagulated thereon were washed with water and, then, dried so as to obtain a composite material consisting of the lead titanate type ceramic powder and the acrylic acid ester copolymer. The composite material thus obtained was kneaded by a roll mill and, then, subjected to roll calendering (elongation degree being 10) so as to obtain a composite material sheet 206μ thick. Finally, electrodes were mounted to both sides of the sheet and a polarizing treatment was applied thereto as in Example 1, thereby producing a composite piezoelectric material. It was found that the composite piezoelectric material exhibited $8.9 \times 10^{-12}$ m/V of piezoelectric constant $d_{31}$ of length extensional mode.

EXAMPLE 3

50 g of lead titanate type ceramic powder having an average particle diameter of 1.9μ was dispersed in 210 ml of deionized water for preparing a suspension. Then, 6.4 g of SBR latex (solid content being 2.6 g) was added to the suspension and the mixture was fully stirred for dispersing the latex in the suspension, followed by gradually dripping 40 ml of an aqueous solution containing 0.01 mol/l of sulfurous acid to the aqueous system so as to coagulate the latex. The ceramic powder particles having the rubber coagulated thereon were washed with water and, then, dried so as to obtain a composite material consisting of the lead titanate type ceramic powder and SBR. The composite material thus obtained was kneaded by a roll mill and, then, subjected to press shaping for 20 minutes under a temperature of 130° C. and a pressure of 125 Kg/cm² so as to obtain a composite material sheet 148μ thick. Finally, electrodes were mounted to both sides of the composite material sheet and a polarizing treatment was applied thereto as in Exmpale 1, thereby obtaining a composite piezoelectric material. The composite piezoelectric material was found to exhibit $6.9 \times 10^{-12}$ m/V of piezoelectric constant $d_{31}$ of length extensional mode.

EXAMPLE 4

300 g of lead zirconate titanate cobalttungstate powder having an average particle diameter of 2μ, 1.15 g of ZnO acting as a curing agent, and 23 g of NBR latex (solid content being 2.6 g) were dispersed in 520 ml of deionized water, followed by dripping 480 ml of an aqueous solution containing 0.1 mol/l of sulfurous acid to the aqueous system so as to coagulate the NBR latex. The coagulated particles were washed with water and, then, dried so as to obtain a composite material containing 7.12% by weight of rubber. The composite material was kneaded by a roll mill and, then, subjected to roll calendering (elongation degree being 8) so as to obtain a composite material sheet 203μ thick.

A tensile strength test and an oil-resisting test were applied to the composite material sheet. The tensile strength test was conducted as in Example 1. On the other hand, the oil-resisting test was conducted in accordance with ASTM No. 3, namely, the tensile strength of the sheet was measured after immersion of the sheet for 70 hours in a standard oil maintained at 100° C. The composite material sheet was found to have a tensile strength of 35 Kg/cm² and an oil-resisting property, i.e., tensile strength after the immersion in the oil, of 28 Kg/cm².

EXAMPLE 5

300 g of lead zirconate titanate cobalttungstate powder having an average particle diameter of 2μ, 1 g of ZnO acting as a curing agent, 3 g of n-butyl acrylate, 20 g of NBR latex (solid content being 2.6 g), 480 ml of an aqueous solution containing 0.1 mol/l of sulfurous acid, and 10 ml of 0.1 N hydrochloric acid aqueous solution were dispersed in 520 ml of deionized water for preparing a suspension. The suspension was put in a ball mill and agitated for 2 hours at 30° C. During the agitation step, graft copolymerization was carried out between n-butyl acrylate coated first on the surfaces of the powder particles and NBR. The powder particles coated with the graft coppolymerizate were washed with water and, then, dried so as to obtain a graft copolymeric composite material containing 6.7% by weight of polymer.

The composite material was kneaded by a roll mill and, then, elongated by a roll calender such that the length of the elongated mass was 8 times as long as that before the elongation (elongation degree being 8), thereby obtaining a composite material sheet 203μ thick. Then, Ag electrodes were formed on both sides of the sheet as in Example 1 for applying a polarizing treatment to the sheet. Specifically, the composite material sheet was put in a silicone oil maintained at 130° C. and 200 KV/cm of D.C. electric field was applied across the electrodes for 2 hours, followed by cooling the silicone oil to room temperature. The resultant composite piezoelectric material was found to exhibit $0.9 \times 10^{-11}$ m/V of piezoelectric constant $d_{31}$ of length extensional mode and $2.4 \times 10^{-11}$ m/V of piezoelectric constant $d_{33}$ of thickness extensional mode.

Additional experiments were conducted in line with the above except the elongation degree employed in the step of preparing composite material sheets. Table 2 shows the properties of the resultant composite piezoelectric materials.

TABLE 2

| Elongation degree | Yong's modulus | piezoelectric constant | |
|---|---|---|---|
| | | $d_{31}$ | $d_{33}$ |
| 2 | $3.5 \times 10^9$ N/m² | $0.5 \times 10^{-11}$ m/V | $1.1 \times 10^{-11}$ m/V |
| 4 | " | $0.65 \times 10^{-11}$ | $1.5 \times 10^{-11}$ |
| 6 | " | $0.8 \times 10^{-11}$ | $2.0 \times 10^{-11}$ |
| 8 | " | $0.9 \times 10^{-11}$ | $2.4 \times 10^{-11}$ |

A tensile strength test and an oil-resisting test were applied as in Example 4 to the composite material sheet having an elongation degree of 8, which was prepared as described above, with the result that the sheet exhibited 72 kg/cm² of tensile strength and 63 kg/cm² of oil-resisting property, i.e., tensile strength after immersion in a hot oil in contrast to 35 kg/cm² and 28 kg/cm² for Example 4. The improvement achieved in Example 5 is thought to be accounted for by the occurrence of graft copolymerization between the vinyl monomer and the rubber.

EXAMPLE 6

60 g of lead titanate powder having an average particle diameter of 1.4μ, 40 g of methyl acrylate monomer, 1.5 g of butyl acrylate monomer, 10 g of NBR latex (solid content being 2.6 g) and 40 ml of an aqueous solution containing 0.01 mol/l of sulfurous acid were suspended in 200 ml of deionized water. The suspension was put in a ball mill and agitated for 2 hours at 80° C. During the agitation step, the methyl acrylate monomer and butyl acrylate monomer were coated first on the surfaces of the powder particles and, then, graft copolymerization took place between the monomers and NBR. The powder particles coated with the graft copolymerizate were washed with water and, then, dried so as to obtain a graft copolymeric composite material containing 2.16% by weight of polymer. A composite piezoelectric material was obtained from the graft copolymeric composite material as in Example 1. Table 3 shows the properties of the produced composite piezoelectric material.

TABLE 3

| elongation digree | thickness (μm) | Young's modulus | dielectric constant | output voltage | $d_{31}$ |
|---|---|---|---|---|---|
| 3 | 240 | $3.3 \times 10^9$ N/m² | 70 | 300 mV | $0.49 \times 10^{-11}$ m/V |
| 7 | 240 | " | 84 | 580 mV | $0.95 \times 10^{-11}$ m/V |

EXAMPLE 7

100 g of PZT powder having an average particle size of 5μ was suspended in 200 ml of deionized water. Then, an aqueous dispersion of vinylidene fluoride-trifluoroethylene copolymer (solid content being 2.8 g)

was dripped to the suspension while stirring the suspension, followed by adding 12.8 g of NBR latex (solid content being 5.2 g) to the mixture which was kept stirred. Further, 40 ml of an aqueous solution containing 0.1 mol/l of calcium chloride was gradually dripped to the mixture while stirring the mixture so as to coagulate the dispersion and latex. The coagulated materials were washed with water and, then, dried so as to obtain a composite material consisting of PZT, vinylidene fluoride-trifluoroethylene copolymer and NBR. A composite piezoelectric material was obtained from the coposite material as in Example 1. The composite piezoelectric material was found to exhibit $3.5 \times 10^{-11}$ m/V of piezoelectric constant $d_{31}$ of length extensional mode.

FIG. 1 shows the relationship between the PZT content and the tensile strength of the composite piezoelectric materials produced as in Example 7 and the control case. In the graph of FIG. 1, the PZT content is plotted on the abscissa with the tensile strength plotted on the ordinate. Curves (a) and (b) shown in FIG. 1 represent the present invention and the control case, respectively. Further, points A and B shown in FIG. 1 denote the shaping limits. It is seen that the PZT contents at the shaping limits A and B are 98.5% by weight and 90% by weight, respectively.

It is clearly seen from FIG. 1 that the composite piezoelectric material produced by the method of this invention maintains a sufficiently high level of tensile strength even if the PZT content thereof is markedly increased. Further, the PZT content at the shaping limit is considerably high.

FIG. 2 shows the relationship between the PZT content and the piezoelectric constant $d_{31}$ (m/V) of the composite piezoelectric materials produced as in Example 1 and the control case. In the graph of FIG. 2, the piezoelectric constant $d_{31}$ (m/V) is plotted on the ordinate with the PZT content plotted on the abscissa. Curves (c) and (d) shown in FIG. 2 represent the present invention and the control case, respectively. It is seen from FIG. 1 that the value of $d_{31}$ for the composite piezoelectric material of this invention is higher than that of the control case if the PZT contents of the samples are the same. It should also be noted that the shaping limit for this invention is higher than that for the control case. It follows that the composite piezoelectric material of this invention can be enabled to exhibit an extremely high value of $d_{31}$ by increasing the PZT content of the material.

What we claim is:

1. A method of producing a composite piezoelectric material, comprising the steps of treating an inorganic dielectric material powder with a latex-containing dispersion so as to coat the surfaces of the powder particles with the rubber particles contained in the latex in a manner to provide encapsulated powder particles, kneading the encapsulated powder particles, shaping the kneaded mass, and polarizing the shaped mass.

2. The method according to claim 1, wherein the latex-containing dispersion contains a radical polymerizable vinyl monomer.

3. The method according to claim 1, wherein the latex-containing dispersion contains a polar fluoropolymer dispersion.

4. The method according to claim 1, wherein the amount of the inorganic dielectric material powder ranges from 20 to 97% by weight of the composite piezoelectric material.

5. The method according to claim 1, wherein the amount of the inorganic dielectric material powder ranges from 80 to 96% by weight of the composite piezoelectric material.

6. The method according to claim 1, wherein the step of treating the inorganic dielectric material powder comprises adding the powder to the latex-containing dispersion, agitating the mixture, adding a coagulating agent to the mixture for coating the surfaces of the powder particles with the rubber particles, water-washing the rubber-coated powder particles, and drying the washed powder particles.

7. The method according to claim 1, 2 or 3, wherein the latex containing dispersion contains a vulcanizing agent.

8. The method according to claim 1, wherein roll calendering is employed in the shaping step.

9. The method according to claim 1, wherein the rubber contained in the latex is a synthetic rubber selected from the group consisting of acrylonitrile-butadiene copolymer, styrene-butadiene copolymer, modified acrylic ester polymer and butadiene homopolymer.

10. The method according to claim 1, wherein the inorganic dielectric material powder is piezoelectric ceramics of perovskite structure.

* * * * *